(12) United States Patent
Hirakata et al.

(10) Patent No.: US 9,843,707 B2
(45) Date of Patent: Dec. 12, 2017

(54) LIGHT-EMITTING DEVICE AND CAMERA

(71) Applicant: Semiconductor Energy Laboratory Co., Ltd., Kanagawa-ken (JP)

(72) Inventors: Yoshiharu Hirakata, Kanagawa (JP);
Nobuharu Ohsawa, Kanagawa (JP);
Hisao Ikeda, Kanagawa (JP);
Kazuhiko Fujita, Kanagawa (JP);
Akihiro Kaita, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/095,432

(22) Filed: Apr. 11, 2016

(65) Prior Publication Data

US 2016/0227087 A1 Aug. 4, 2016

Related U.S. Application Data

(63) Continuation of application No. 14/281,014, filed on May 19, 2014, now Pat. No. 9,319,596.

(30) Foreign Application Priority Data

May 21, 2013 (JP) ................................. 2013-107153

(51) Int. Cl.
*G03B 15/03* (2006.01)
*H04N 5/225* (2006.01)
(Continued)

(52) U.S. Cl.
CPC ........... *H04N 5/2256* (2013.01); *G03B 15/03* (2013.01); *G03B 15/05* (2013.01); *H01L 51/5212* (2013.01); *H01L 51/5275* (2013.01); *H04N 5/2354* (2013.01); *H04N 5/23293* (2013.01); *H05B 33/08* (2013.01); *H05B 33/0815* (2013.01); *G03B 2215/0567* (2013.01); *H01L 2227/326* (2013.01);
(Continued)

(58) Field of Classification Search
CPC ................... G03B 15/06; G03B 15/05; G03B 2215/0503; G03B 15/03; G03B 19/04; G03B 9/70
USPC ................................. 396/199, 176, 181, 124
See application file for complete search history.

(56) References Cited

U.S. PATENT DOCUMENTS 7,598,927 B2  10/2009  Yamazaki et al.
8,319,714 B2  11/2012  Kojima et al.
(Continued)

FOREIGN PATENT DOCUMENTS

CN  001977301 A   6/2007
CN  202634506     12/2012
(Continued)

OTHER PUBLICATIONS

International Search Report re Application No. PCT/JP2014/062545, dated Aug. 19, 2014.
(Continued)

*Primary Examiner* — Minh D A
(74) *Attorney, Agent, or Firm* — Husch Blackwell LLP

(57) ABSTRACT

A small light-emitting device is provided. A light-emitting device which is less likely to produce a shadow is provided. A structure including a switching circuit for supplying a pulsed constant current and a light-emitting panel supplied with the pulsed constant current has been conceived.

8 Claims, 7 Drawing Sheets

(51) Int. Cl.
*H04N 5/235* (2006.01)
*H05B 33/08* (2006.01)
*G03B 15/05* (2006.01)
*H01L 51/52* (2006.01)
*H04N 5/232* (2006.01)

(52) U.S. Cl.
CPC ............... *H01L 2251/5338* (2013.01); *H01L 2251/5361* (2013.01); *H01L 2251/5376* (2013.01)

(56) References Cited

U.S. PATENT DOCUMENTS

| | | |
|---|---|---|
| 8,550,907 B2 | 10/2013 | Yamazaki et al. |
| 2002/0003961 A1* | 1/2002 | Yamaguchi ......... G02B 6/0046 396/429 |
| 2003/0146755 A1 | 8/2003 | Kitazawa et al. |
| 2004/0239799 A1 | 12/2004 | Suzuki et al. |
| 2007/0146333 A1 | 6/2007 | Yamazaki et al. |
| 2008/0185971 A1 | 8/2008 | Kinoshita |
| 2008/0246403 A1* | 10/2008 | Sagawa ................ G09G 3/3233 315/35 |
| 2009/0029739 A1 | 1/2009 | Okamoto et al. |
| 2009/0096385 A1 | 4/2009 | Yamauchi |
| 2010/0066257 A1 | 3/2010 | Lin et al. |
| 2011/0101880 A1 | 5/2011 | Ribarich |
| 2011/0181537 A1 | 7/2011 | Okamoto et al. |
| 2011/0205484 A1 | 8/2011 | Huang |
| 2011/0241558 A1 | 10/2011 | Yamazaki et al. |
| 2012/0026348 A1* | 2/2012 | Yun ...................... G03B 7/26 348/208.4 |
| 2012/0075225 A1 | 3/2012 | Okamoto et al. |
| 2012/0205679 A1 | 8/2012 | Hiroki et al. |
| 2013/0063676 A1* | 3/2013 | Tsuchihashi ........ G02F 1/13318 349/54 |
| 2013/0252667 A1 | 9/2013 | Senda |
| 2013/0328751 A1 | 12/2013 | Coleman |

FOREIGN PATENT DOCUMENTS

| | | |
|---|---|---|
| JP | 2004-109430 A | 4/2004 |
| JP | 2007-163876 A | 6/2007 |
| JP | 2009-130132 A | 6/2009 |
| JP | 2009-295769 A | 12/2009 |
| JP | 2010-004692 A | 1/2010 |
| JP | 2010-028366 A | 2/2010 |
| JP | 2012-129478 A | 7/2012 |
| TW | 200535784 | 11/2005 |
| WO | WO 2005/106835 A1 | 11/2005 |

OTHER PUBLICATIONS

Written Opinion re Application No. PCT/JP2014/062545, dated Aug. 19, 2014.
Chinese Office Action re Application No. CN 201480028594.5, dated Jan. 5, 2017.
Taiwanese Office Action re Application No. TW 103117142, dated Sep. 7, 2017.

* cited by examiner

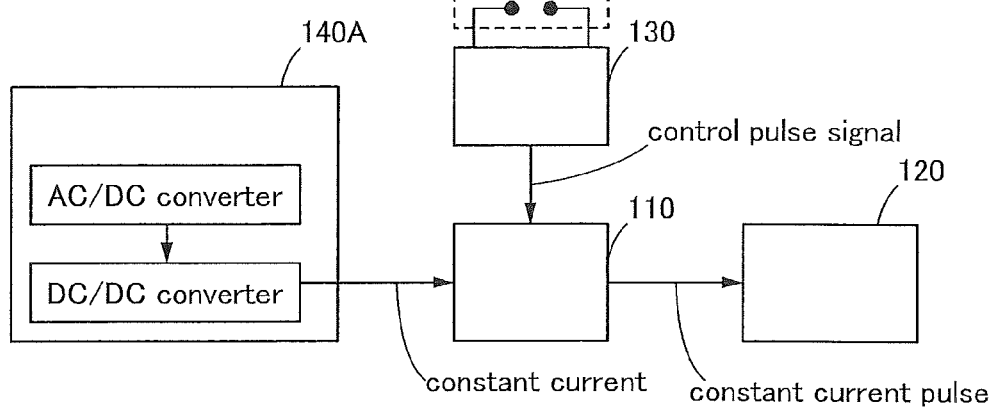
FIG. 1A1
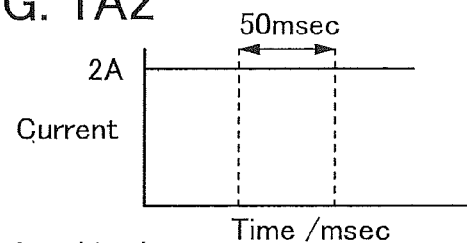
FIG. 1A2
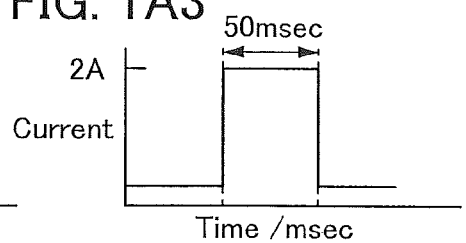
FIG. 1A3
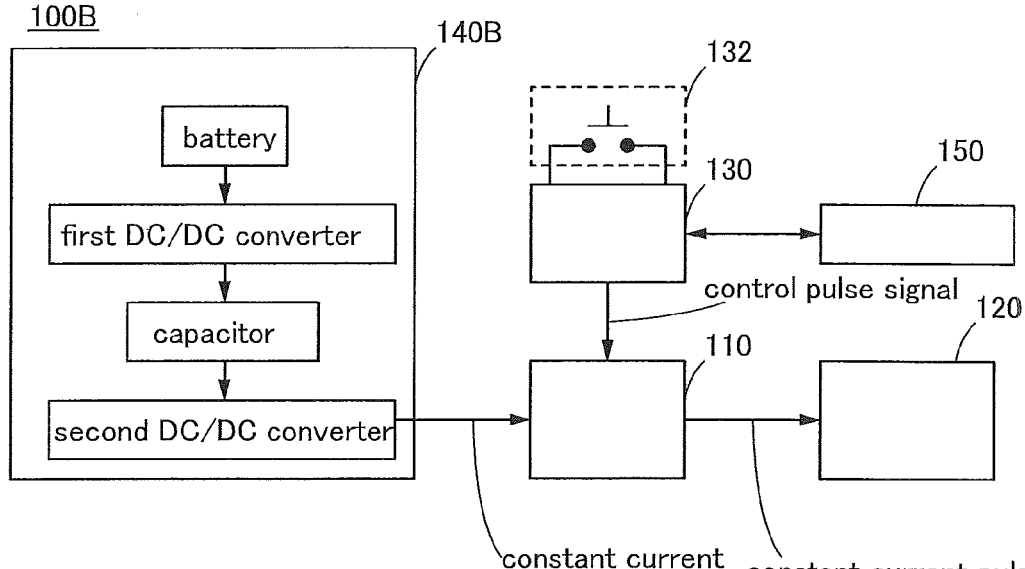
FIG. 1B1
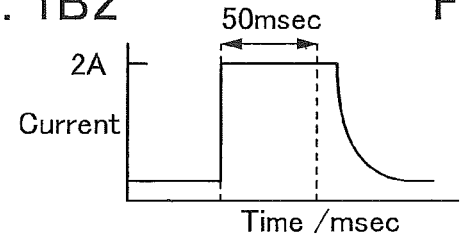
FIG. 1B2
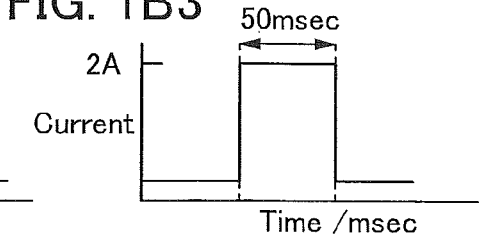
FIG. 1B3

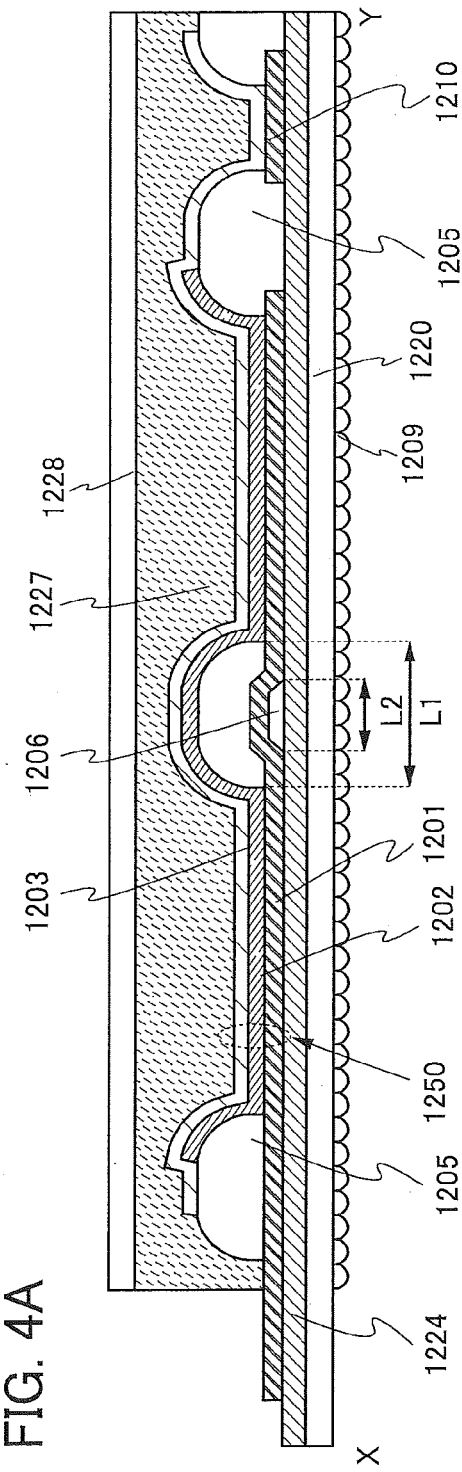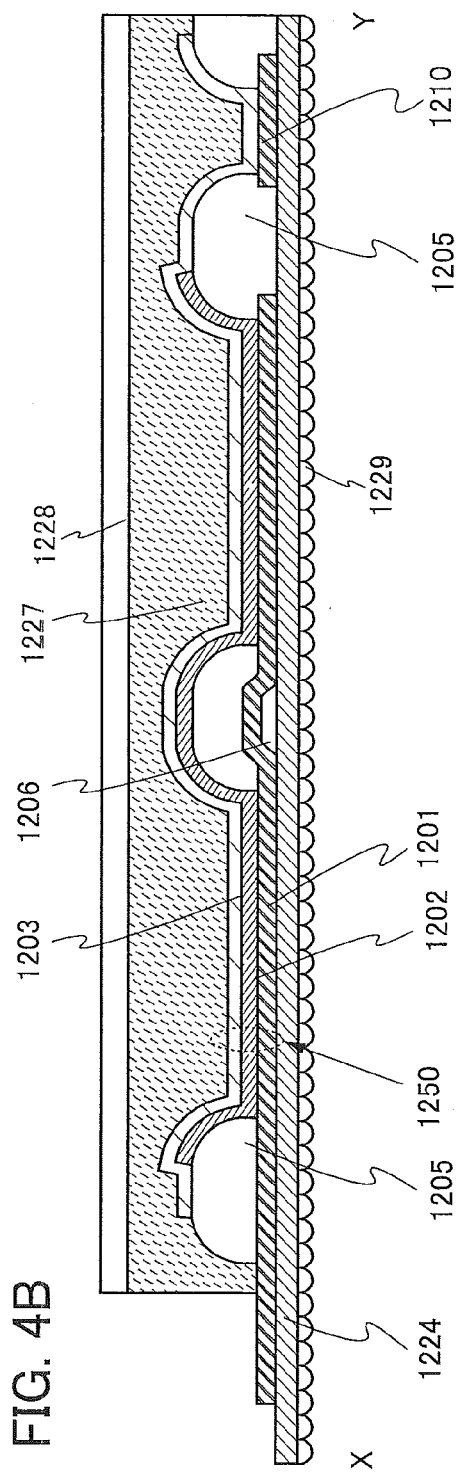

LIGHT-EMITTING DEVICE AND CAMERA

This application is a continuation of copending U.S. application Ser. No. 14/281,014, filed on May 19, 2014 which is incorporated herein by reference.

TECHNICAL FIELD

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. In particular, the present invention relates to a light-emitting device.

BACKGROUND ART

Research and development have been extensively conducted on light-emitting elements using organic electroluminescence (EL) (also referred to as organic EL elements). In a basic structure of an organic EL element, a layer containing a light-emitting organic compound (also referred to as an EL layer) is provided between a pair of electrodes. By applying voltage to this element, light emission from the light-emitting organic compound can be obtained.

Since an organic EL element can be formed in the form of a film, an element with a large area can be easily formed. Thus, organic EL elements also have great potential as planar light sources which can be applied to lighting devices and the like.

For example, a lighting device including an organic EL element is disclosed in Patent Document 1.

REFERENCE

Patent Document

[Patent Document 1] Japanese Published Patent Application No. 2009-130132

DISCLOSURE OF INVENTION

Cameras are equipped with flashes so as to be able to take photographs in a dark place.

Smaller and/or lighter cameras are demanded for easy portability.

However, as the size of a flash decreases, the shape of its light-emitting portion becomes more linear or point-like, and the following problem emerges.

Light from a light source travels in a straight line; therefore, a smaller light source casts a sharper shadow of an object.

Thus, when a photograph of a human face is taken in a dark place using a flash, for example, a shadow of a nose might be cast on a cheek.

One embodiment of the present invention was made in view of the foregoing technical background. Thus, an object is to provide a small light-emitting device. Another object is to provide a light-emitting device which is less likely to produce a shadow.

Note that the descriptions of these objects do not disturb the existence of other objects. Note that in one embodiment of the present invention, there is no need to achieve all the objects. Note that other objects will be apparent from the description of the specification, the drawings, the claims, and the like and other objects can be derived from the description of the specification, the drawings, the claims, and the like.

Embodiments described below include an embodiment of the present invention which was made with a focus on a configuration of a light-emitting portion which enables a planar light source to emit light for a short time at a high luminance.

A light-emitting device of one embodiment of the present invention includes a switching circuit for supplying a pulsed constant current and a light-emitting panel supplied with the pulsed constant current.

One embodiment of the present invention is a light-emitting device which includes a switching circuit supplied with a constant current and a control pulse signal and capable of supplying a constant current pulse, a constant current power source capable of supplying the constant current, a driver circuit capable of supplying the control pulse signal which includes a start switch, and a light-emitting panel supplied with the constant current pulse.

The driver circuit outputs the control pulse signal in response to a switching operation of the start switch so that the switching circuit supplies a constant current with a half width of more than or equal to 1 millisecond and less than or equal to 1000 milliseconds.

In the light-emitting device of one embodiment of the present invention, the light-emitting panel may include a support substrate, and a light-emitting element extending in a planar manner over the support substrate, and the light-emitting element includes a first electrode closer to the support substrate than a second electrode is, the second electrode overlapping with the first electrode, and an EL layer between the first electrode and the second electrode.

In the light-emitting device of one embodiment of the present invention, the light-emitting panel may include a curved surface, a support substrate having flexibility, and a light-emitting element extending in a planar manner over the support substrate, and the light-emitting element includes a first electrode on a support substrate side, a second electrode overlapping with the first electrode, and an EL layer between the first electrode and the second electrode.

In the light-emitting device of one embodiment of the present invention, the constant current power source may include an AC-DC converter for supplying a direct current and a DC-DC converter supplied with the direct current and capable of supplying the constant current. Note that in this specification, the AC-DC converter refers to a device which converts an alternating current into a direct current, and the DC-DC converter refers to a device which converts a voltage of a direct current from one level to another. The constant current power source may include a current sensor as well as the DC-DC converter.

In one embodiment of the present invention, the light-emitting device may include a battery for supplying a first voltage, a first DC-DC converter supplied with the first voltage and capable of supplying a second voltage higher than the first voltage, a capacitor supplied with the second voltage, and a second DC-DC converter supplied with power from the capacitor and capable of supplying a constant current.

One embodiment of the present invention is a camera or a digital still camera which includes the light-emitting device of any of the above embodiments.

According to one embodiment of the present invention, a small light-emitting device can be provided. Alternatively, a light-emitting device which is less likely to produce a shadow can be provided.

BRIEF DESCRIPTION OF DRAWINGS

FIGS. 1A1, 1A2, 1A3, 1B1, 1B2, and 1B3 illustrate configurations of light-emitting devices of embodiments.

FIG. 3 illustrates a light-emitting panel of one embodiment.

FIGS. 4A and 4B each illustrate a light-emitting panel of one embodiment.

BEST MODE FOR CARRYING OUT THE INVENTION

Figure 2A:
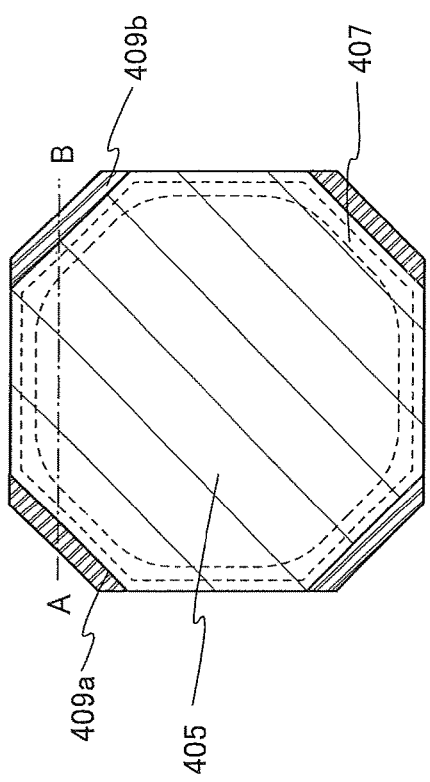
FIGS. 2A and 2B illustrate a light-emitting panel of one embodiment.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a configuration of a light-emitting device of one embodiment of the present invention will be described with reference to FIGS. 1A1 to 1A3.

FIG. 1A1 is a block diagram illustrating a configuration of a light-emitting device of one embodiment of the present invention.

A light-emitting device 100A described in this embodiment includes a switching circuit 110 supplied with a constant current and a control pulse signal and capable of supplying a constant current pulse, a constant current DC power source 140A capable of supplying the constant current, a driver circuit 130 which includes a start switch 132 and is capable of supplying the control pulse signal, and a light-emitting panel 120 supplied with the constant current pulse. The driver circuit 130 outputs the control pulse signal in response to a switching operation of the start switch 132 so that the switching circuit 110 supplies a constant current with a half width of more than or equal to 1 millisecond and less than or equal to 1000 milliseconds.

The light-emitting device 100A described in this embodiment includes the switching circuit 110 for supplying a pulsed constant current and the light-emitting panel 120 supplied with the pulsed constant current. This allows the pulsed constant current to be supplied to a light-emitting portion extending in a planar manner without increases in thickness. Accordingly, a small light-emitting device can be provided. Alternatively, a light-emitting device which is less likely to produce a shadow can be provided.

Components of the light-emitting device 100A of one embodiment of the present invention will be described below.

《Light-Emitting Panel》

The light-emitting panel 120 includes a support substrate 401 and a light-emitting element 403 extending in a planar manner over the support substrate 401. The light-emitting element 403 includes a first electrode 421 on the support substrate 401 side, a second electrode 425 overlapping with the first electrode 421, and an EL layer 423 between the first electrode 421 and the second electrode 425 (see FIGS. 2A and 2B).

The light-emitting panel 120 extending in a planar manner has a light-emitting portion with an area of more than or equal to 5 cm$^2$ and less than or equal to 200 cm$^2$, preferably more than or equal to 15 cm$^2$ and less than or equal to 100 cm$^2$.

Accordingly, the light-emitting panel 120 is thinner and lighter than a conventional xenon lamp or the like. Heat generated by light emission is diffused over a large area in the light-emitting panel 120 and is therefore released efficiently. Accordingly, heat accumulation in the light-emitting panel 120 is suppressed, and thus, deterioration of the light-emitting panel 120 is suppressed.

Note that in this specification, the EL layer refers to a layer provided between a pair of electrodes in the light-emitting element 403. Thus, a light-emitting layer containing an organic compound that is a light-emitting substance which is provided between electrodes is one embodiment of the EL layer.

The light-emitting panel 120 can be configured to emit white light by using a properly selected light-emitting organic compound. For example, a plurality of light-emitting organic compounds which emit light of complementary colors can be used. Alternatively, light-emitting organic compounds which emit light of red, green, and blue can be used. Furthermore, different emission spectra can be selected from a variety of organic compounds. Accordingly, the light-emitting device 100A having excellent white balance can be obtained.

By using a light-emitting organic compound, an emission spectrum can be broadened as compared with that of a light-emitting diode with an inorganic material. Light having a broad emission spectrum is close to natural light and suitable for photography. A flexible light-emitting panel including a flexible support substrate and an organic EL element over the support substrate can be placed along a housing having a curved surface. In that case, a light-emitting device can be placed regardless of the design of a housing. For example, a flash can be placed along a camera housing having a curved surface.

Note that the structure of the light-emitting panel 120 will be described in detail in Embodiment 2.

《Constant Current DC Power Source》

The constant current DC power source 140A includes an AC-DC converter for supplying a direct current and a DC-DC converter supplied with the direct current.

An example of a constant current supplied from the DC-DC converter is illustrated in FIG. 1A2.

《Driver Circuit》

The driver circuit 130 supplies a control pulse signal with a predetermined width.

The predetermined width is more than or equal to 1 millisecond and less than or equal to 1000 milliseconds, preferably more than or equal to 10 milliseconds and less than or equal to 100 milliseconds.

For example, the driver circuit 130 can be configured using the start switch 132, a latch circuit, and a monostable multivibrator.

Specifically, the start switch 132 is used to supply a high or low signal to the latch circuit. The latch circuit supplies a trigger signal. The monostable multivibrator supplied with the trigger signal supplies a rectangular wave with a predetermined width as the control pulse signal.

Note that the control pulse signal may be supplied to the constant current DC power source 140A and used to control the constant current DC power source 140A. Specifically, the control pulse signal may be used to control the timing of supply of the constant current from the DC-DC converter. Accordingly, the waveform of the constant current with the predetermined width, i.e., the constant current pulse, can be shaped.

《Switching Circuit》

The switching circuit 110 supplies the constant current pulse to the light-emitting panel 120 while being supplied with the constant current and the control pulse signal.

For example, the switching circuit 110 can be configured using a power transistor or a power FET. Specifically, the switching circuit 110 can be configured such that the control pulse signal is supplied to a gate of the power transistor, the constant current is supplied to a first electrode of the power transistor, and the light-emitting panel 120 is electrically connected to a second electrode of the power transistor.

Figure 3:
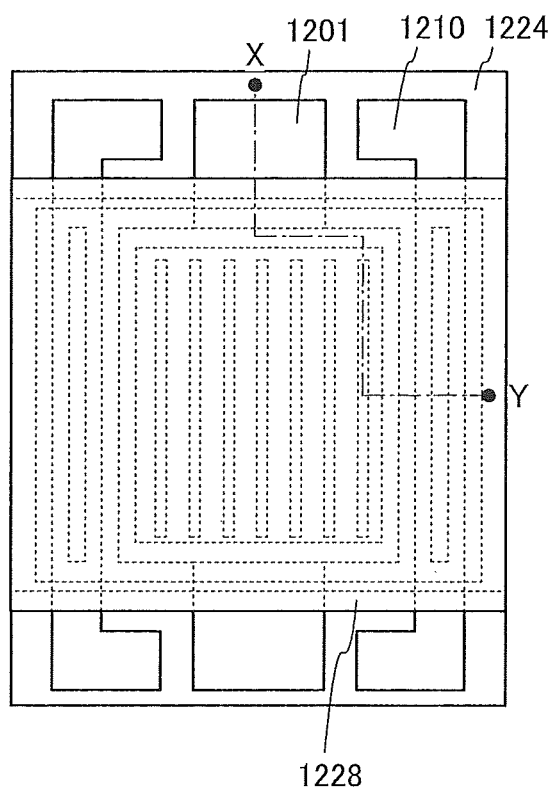

Note that an example of a change over time of the constant current pulse supplied from the constant current DC power source 140A is illustrated in FIG. 1A3. For example, a current of 2 A can be supplied to the light-emitting panel 120 for 50 milliseconds.

Modification Example

A light-emitting device given as a modification example of this embodiment will be described with reference to FIGS. 1B1 to 1B3.

FIG. 1B1 is a block diagram illustrating a configuration of a light-emitting device of one embodiment of the present invention.

A light-emitting device 100B described with reference to FIG. 1B1 differs from the light-emitting device 100A described with reference to FIG. 1A1 in that it includes a constant current DC power source 140B with a different configuration and includes a counter circuit. Note that the other components are the same as those of the light-emitting device 100A described with reference to FIG. 1A1, for which the above description can be referred to.

《Modification Example of Constant Current DC Power Source》

The constant current DC power source 140B described in the modification example of this embodiment includes a battery for supplying a first voltage, a first DC-DC converter supplied with the first voltage and capable of supplying a second voltage higher than the first voltage, a capacitor supplied with the second voltage, and a second DC-DC converter supplied with power from the capacitor.

The first DC-DC converter steps up the voltage of the battery to the second voltage and supplies the second voltage.

The capacitor is charged with the second voltage.

The second DC-DC converter is supplied with the power stored in the capacitor and supplies the constant current.

With this configuration, the second DC-DC converter can supply the constant current while the capacitor is supplying the power to the second DC-DC converter. Note that when the power stored in the capacitor is less than a predetermined level, the second DC-DC converter cannot supply the constant current.

An example of a change over time of the current supplied from the constant current DC power source 140B is illustrated in FIG. 1B2.

The constant current DC power source 140B can supply the constant current for a period at least longer than the width of the control pulse signal (e.g., 50 milliseconds) supplied from the driver circuit 130. When the current flows through the switching circuit 110, the power stored in the capacitor is consumed; eventually, it becomes impossible for the constant current DC power source 140B to supply the constant current. As a result, a current that is not a rectangular wave flows to the light-emitting panel 120, whereby the light-emitting panel 120 emits light at a useless luminance lower than a predetermined luminance and consumes unnecessary power. The switching circuit 110 can prevent such unnecessary power consumption by stopping the supply of current after the supply of current for a predetermined time. Note that an example of a change over time of the current supplied from the switching circuit 110 is illustrated in FIG. 1B3.

In this manner, the constant current DC power source 140B can supply the constant current by using the battery. Accordingly, the light-emitting device 100B which can be easily carried around can be provided.

《Counter Circuit》

A counter circuit 150 counts the number of times the driver circuit 130 supplies the control pulse signal. Thus, the number of times the light-emitting panel 120 has emitted light can be known.

For example, the luminance of the light-emitting panel 120 may be decreased depending on the number of times the light-emitting panel 120 has emitted light.

The decrease of the luminance of the light-emitting panel 120 can be compensated for by feeding back the number of times counted by the counter circuit 150 to the driver circuit 130 and increasing the width of the control pulse signal.

Alternatively, the decrease of the luminance of the light-emitting panel 120 can be compensated for by feeding back the number of times counted by the counter circuit 150 to the constant current DC power source 140B and increasing the amount of the constant current supplied from the constant current DC power source 140B.

This embodiment can be combined with any of the other embodiments in this specification as appropriate.

Embodiment 2

In this embodiment, a structure of a light-emitting panel that can be used for the light-emitting device of one embodiment of the present invention will be described with reference to FIGS. 2A and 2B, FIG. 3, and FIGS. 4A and 4B.

《Structural Example 1 of Light-Emitting Panel》

Figure 2B:
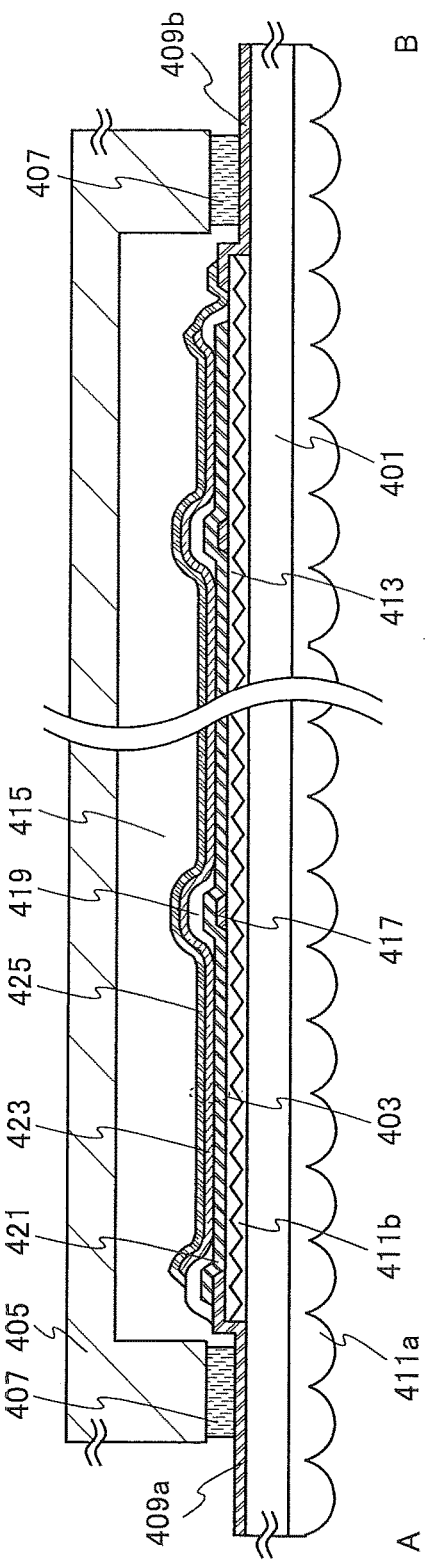

FIG. 2A is a plan view illustrating a light-emitting panel of one embodiment of the present invention, and FIG. 2B is a cross-sectional view taken along dashed-dotted line A-B in FIG. 2A.

In the light-emitting panel illustrated in FIGS. 2A and 2B, the light-emitting element 403 is provided in a space 415 surrounded by the support substrate 401, a sealing substrate 405, and a sealing material 407. The light-emitting element 403 is an organic EL element having a bottom-emission structure; specifically, the first electrode 421 which transmits visible light is provided over the support substrate 401, the EL layer 423 is provided over the first electrode 421, and the second electrode 425 which reflects visible light is provided over the EL layer 423.

The structure of the light-emitting element used in one embodiment of the present invention is not limited to the bottom-emission structure and may be a top-emission structure, for example. The structure of the light-emitting element that can be used in one embodiment of the present invention will be described in detail in Embodiment 3.

A first terminal 409a is electrically connected to an auxiliary wiring 417 and the first electrode 421. An insulating layer 419 is provided over the first electrode 421 in a region which overlaps with the auxiliary wiring 417. The first terminal 409a is electrically insulated from the second electrode 425 by the insulating layer 419. A second terminal 409b is electrically connected to the second electrode 425. Note that although the first electrode 421 is formed over the auxiliary wiring 417 in this embodiment, the auxiliary wiring 417 may be formed over the first electrode 421.

A light extraction structure 411a is preferably provided at the interface between the support substrate 401 and the atmosphere. When provided at the interface between the support substrate 401 and the atmosphere, the light extraction structure 411a can reduce light which cannot be extracted to the atmosphere due to total reflection, resulting in increased light extraction efficiency of the light-emitting panel.

In addition, a light extraction structure 411b is preferably provided between the light-emitting element 403 and the support substrate 401. When the light extraction structure 411b has unevenness, a planarization layer 413 is preferably provided between the light extraction structure 411b and the first electrode 421. Accordingly, the first electrode 421 can be a flat film, and generation of leakage current in the EL layer 423 due to the unevenness of the first electrode 421 can be prevented. Further, because of the light extraction structure 411b at the interface between the planarization layer 413 and the support substrate 401, light which cannot be extracted to the atmosphere due to total reflection can be reduced, so that the light extraction efficiency of the light-emitting panel can be increased.

As a material of the light extraction structure 411a and the light extraction structure 411b, a resin can be used, for example. Alternatively, for the light extraction structure 411a and the light extraction structure 411b, a hemispherical lens, a micro lens array, a film provided with an uneven surface structure, a light diffusing film, or the like can be used. For example, the light extraction structure 411a and the light extraction structure 411b can be formed by attaching the lens or film to the support substrate 401 with an adhesive or the like which has substantially the same refractive index as the support substrate 401 or the lens or film.

The surface of the planarization layer 413 which is in contact with the first electrode 421 is flatter than the surface of the planarization layer 413 which is in contact with the light extraction structure 411b. As a material of the planarization layer 413, a material with a light-transmitting property and a high refractive index (e.g., glass, a resin, or a liquid substance such as a refractive index liquid) can be used.

Note that the light-emitting panel of one embodiment of the present invention is not necessarily provided with any light extraction structure. In that case, the second electrode which reflects visible light can be used as a mirror, which is preferable.

《Structural Example 2 of Light-Emitting Panel》

FIG. 3 is a plan view illustrating a light-emitting panel of one embodiment of the present invention, and FIGS. 4A and 4B are each a cross-sectional view taken along dashed-dotted line X-Y in FIG. 3.

In the light-emitting panel illustrated in FIG. 4A, a light-emitting element 1250 is provided over a support substrate 1220 with an insulating film 1224 provided therebetween. An auxiliary wiring 1206 is provided over the insulating film 1224 and is electrically connected to a first electrode 1201. An end portion of the first electrode 1201 and an end portion of a terminal 1210 are covered with a partition wall 1205. Further, the partition wall 1205 is provided to cover the auxiliary wiring 1206 with the first electrode 1201 provided therebetween. The light-emitting element 1250 is sealed with the support substrate 1220, a sealing substrate 1228, and a sealing material 1227. A light extraction structure 1209 is attached to the surface of the support substrate 1220. A flexible light-emitting panel can be obtained by using flexible substrates as the support substrate 1220 and the sealing substrate 1228.

The light-emitting element 1250 is an organic EL element having a bottom-emission structure; specifically, the first electrode 1201 which transmits visible light is provided over the support substrate 1220, an EL layer 1202 is provided over the first electrode 1201, and a second electrode 1203 which reflects visible light is provided over the EL layer 1202.

In the light-emitting panel illustrated in FIG. 4B, a support substrate 1229 having a light extraction structure is provided instead of the support substrate 1220 and the light extraction structure 1209 of the light-emitting panel illustrated in FIG. 4A. The support substrate 1229 has both a function as a support and a function of improving the light extraction efficiency of the light-emitting panel.

As methods for forming a light-emitting element over a flexible substrate in the case of manufacturing a flexible light-emitting panel, there are methods such as a first method in which the light-emitting element is directly formed over a flexible substrate, and a second method in which the light-emitting element is formed over a highly heat-resistant substrate (hereinafter referred to as a formation substrate) which is different from a flexible substrate and the light-emitting element is then separated from the formation substrate and transferred to the flexible substrate.

In the case of using a substrate that is resistant to heat applied in the process of forming the light-emitting element, such as a glass substrate thin enough to have flexibility, the first method is preferably used because the process can be simplified.

When the second method is used, an insulating film with low water permeability or the like which is formed over a formation substrate can be transferred to a flexible substrate. Therefore, even when an organic resin with high water permeability and low heat resistance or the like is used as a material of the flexible substrate, a flexible light-emitting panel with high reliability can be manufactured.

《Materials of Light-Emitting Panel》

Examples of materials that can be used for the light-emitting panel of one embodiment of the present invention are described.

[Substrate]

The substrate through which light emitted from the light-emitting element is extracted is formed using a material that transmits the light. For example, a material such as glass, quartz, ceramics, sapphire, or an organic resin can be used.

The weight and thickness of the light-emitting panel can be decreased by using a thin substrate. Furthermore, a flexible light-emitting panel can be obtained by using a substrate that is thin enough to have flexibility. The flexible light-emitting panel can be stored in a folded state when not in use. The flexible light-emitting panel can be used as a lighting device which emits flash light over a large area, as an alternative to a board reflector in a photography studio. Alternatively, a foldable lighting device can be provided.

Examples of glass include alkali-free glass, barium borosilicate glass, aluminoborosilicate glass, and the like.

Examples of materials having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus a light-emitting panel using this substrate can also be lightweight.

Since the substrate through which light is not extracted does not need a light-transmitting property, a metal substrate using a metal material or an alloy material or the like can be used as well as the above-mentioned substrates. A metal material and an alloy material, which have high thermal conductivity, are preferred because they can easily conduct heat to the whole sealing substrate and accordingly can prevent a local temperature rise in the light-emitting panel. To obtain flexibility or bendability, the thickness of a metal substrate is preferably greater than or equal to 10 μm and less than or equal to 200 μm, more preferably greater than or equal to 20 μm and less than or equal to 50 μm.

Although there is no particular limitation on a material of the metal substrate, it is preferable to use, for example, aluminum, copper, nickel, a metal alloy such as an aluminum alloy or stainless steel.

It is possible to use a substrate subjected to insulation treatment in such a manner that a surface of a conductive substrate is oxidized or an insulating film is formed on the surface. An insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

The flexible substrate may have a stacked structure of a layer of any of the above-mentioned materials and a hard coat layer (e.g., a silicon nitride layer) which protects a surface of the light-emitting panel from damage or the like, a layer (e.g., an aramid resin layer) which can disperse pressure, or the like. Furthermore, to suppress a decrease in the lifetime of the light-emitting element due to moisture and the like, an insulating film with low water permeability may be provided. For example, a film containing nitrogen and silicon (e.g., a silicon nitride film, a silicon oxynitride film) or a film containing nitrogen and aluminum (e.g., an aluminum nitride film) may be provided.

The substrate may be formed by stacking a plurality of layers. When a glass layer is used, a barrier property against water and oxygen can be improved and thus a reliable light-emitting panel can be provided.

A substrate in which a glass layer, an adhesive layer, and an organic resin layer are stacked from the side closer to a light-emitting element can be used. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and a high flexibility. The thickness of the organic resin layer is greater than or equal to 10 μm and less than or equal to 200 μm, preferably greater than or equal to 20 μm and less than or equal to 50 μm. With such an organic resin layer provided on an outer side of the glass layer, breakage or a crack of the glass layer can be inhibited, resulting in increased mechanical strength. With the substrate that includes such a composite material of a glass material and an organic resin, a highly reliable and flexible light-emitting panel can be provided.

[Insulating Film]

An insulating film may be provided between the support substrate and the light-emitting element. As the insulating film, an inorganic insulating film such as a silicon oxide film, a silicon nitride film, a silicon oxynitride film, or a silicon nitride oxide film can be used. In order to suppress the entry of moisture or the like into the light-emitting element, an insulating film with low water permeability such as a silicon oxide film, a silicon nitride film, or an aluminum oxide film is particularly preferable. For a similar purpose and with a similar material, an insulating film covering the light-emitting element may be provided.

[Partition Wall]

For the partition wall, an organic resin or an inorganic insulating material can be used. As the organic resin, for example, a polyimide resin, a polyamide resin, an acrylic resin, a siloxane resin, an epoxy resin, or a phenol resin can be used. As the inorganic insulating material, silicon oxide, silicon oxynitride, or the like can be used. In particular, a photosensitive resin is preferably used for easy formation of the partition wall.

There is no particular limitation on the method for forming the partition wall. A photolithography method, a sputtering method, an evaporation method, a droplet discharging method (e.g., an inkjet method), a printing method (e.g., a screen printing method or an offset printing method), or the like can be used.

[Auxiliary Wiring]

The auxiliary wiring is not necessarily provided; however, the auxiliary wiring is preferably provided because voltage drop due to the resistance of an electrode can be prevented.

For the auxiliary wiring, a single layer or a stacked layer using a material selected from copper (Cu), titanium (Ti), tantalum (Ta), tungsten (W), molybdenum (Mo), chromium (Cr), neodymium (Nd), scandium (Sc), or nickel (Ni) or an alloy material including any of these materials as its main component is used. Aluminum can also be used as a material of the auxiliary wiring, and in that case, in order to prevent the problem of corrosion, a stacked layer is formed and aluminum is used for a layer which is not in contact with ITO or the like. The thickness of the auxiliary wiring can be greater than or equal to 0.1 μm and less than or equal to 3 μm, preferably greater than or equal to 0.1 μm and less than or equal to 0.5 μm.

When a paste (e.g., silver paste) is used as a material for the auxiliary wiring, metal particles forming the auxiliary wiring aggregate; therefore, the surface of the auxiliary wiring is rough and has many gaps. Thus, it is difficult for the EL layer to completely cover the auxiliary wiring; accordingly, the upper electrode and the auxiliary wiring are electrically connected to each other easily, which is preferable.

[Sealing Material]

A method for sealing the light-emitting panel is not limited, and either solid sealing or hollow sealing can be employed. For example, a glass material such as a glass frit, or a resin material such as a resin that is curable at room temperature (e.g., a two-component-mixture-type resin), a light curable resin, or a heat-curable resin can be used. The light-emitting panel may be filled with an inert gas such as nitrogen or argon, or resin such as a polyvinyl chloride (PVC) resin, an acrylic resin, a polyimide resin, an epoxy resin, a silicone resin, a polyvinyl butyral (PVB) resin, or an ethylene vinyl acetate (EVA) resin. Further, a drying agent may be contained in the resin.

[Light Extraction Structure]

For the light extraction structure, a hemispherical lens, a micro lens array, a film provided with an uneven surface structure, a light diffusing film, or the like can be used. For example, the light extraction structure can be formed by attaching the lens or film to the substrate with an adhesive or the like which has substantially the same refractive index as the substrate or the lens or film.

This embodiment can be combined with any of the other embodiments in this specification as appropriate.

Embodiment 3

In this embodiment, light-emitting elements which can be used in the light-emitting device of one embodiment of the present invention will be described with reference to FIGS. 5A to 5D.

⟨⟨Structural Example of Light-Emitting Element⟩⟩

Figure 5A:
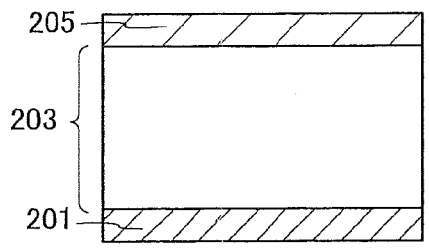
FIGS. 5A to 5D each illustrate a light-emitting element of one embodiment.

A light-emitting element illustrated in FIG. 5A includes an EL layer 203 between a first electrode 201 and a second electrode 205. In this embodiment, the first electrode 201 serves as an anode, and the second electrode 205 serves as a cathode.

When a voltage higher than the threshold voltage of the light-emitting element is applied between the first electrode 201 and the second electrode 205, holes are injected to the EL layer 203 from the first electrode 201 side and electrons are injected to the EL layer 203 from the second electrode 205 side. The injected electrons and holes recombine in the EL layer 203 and a light-emitting substance contained in the EL layer 203 emits light.

The EL layer 203 includes at least a light-emitting layer 303 containing a light-emitting substance.

In addition to the light-emitting layer, the EL layer 203 may further include one or more layers containing any of a substance with a high hole-injection property, a substance with a high hole-transport property, a substance with a high electron-transport property, a substance with a high electron-injection property, a substance with a bipolar property (a substance with a high electron-transport property and a high hole-transport property), and the like. For the EL layer 203, either a low molecular compound or a high molecular compound can be used, and an inorganic compound may also be used.

Figure 5B:
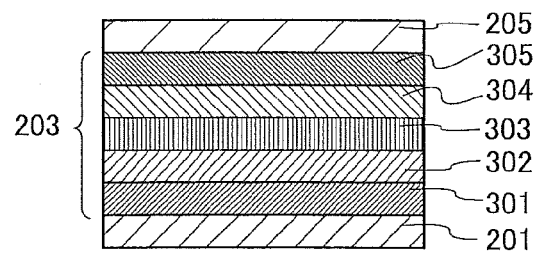

A light-emitting element illustrated in FIG. 5B includes the EL layer 203 between the first electrode 201 and the second electrode 205, and in the EL layer 203, a hole-injection layer 301, a hole-transport layer 302, the light-emitting layer 303, an electron-transport layer 304, and an electron-injection layer 305 are stacked in that order from the first electrode 201 side.

Figure 5C:
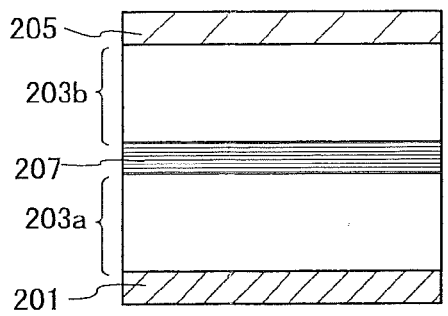
Figure 5D:
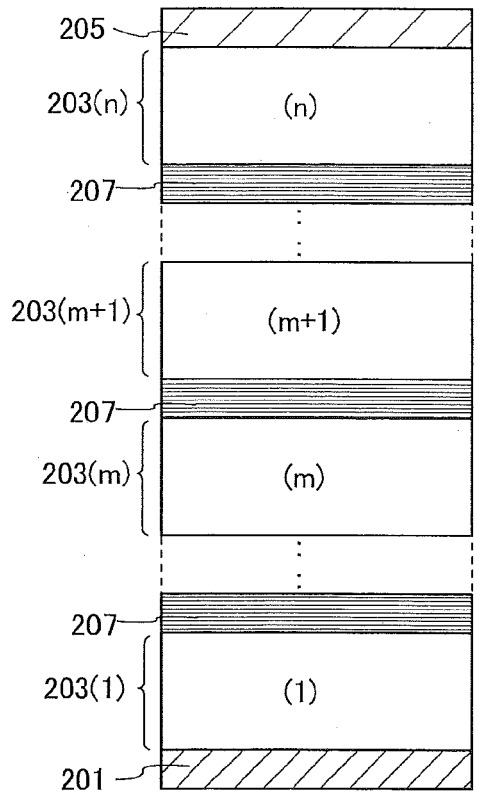

As in light-emitting elements illustrated in FIGS. 5C and 5D, a plurality of EL layers may be stacked between the first electrode 201 and the second electrode 205. In this case, an intermediate layer 207 is preferably provided between the stacked EL layers. The intermediate layer 207 includes at least a charge-generation region.

For example, the light-emitting element illustrated in FIG. 5C includes the intermediate layer 207 between a first EL layer 203a and a second EL layer 203b. The light-emitting element illustrated in FIG. 5D includes n EL layers (n is a natural number of 2 or more), and the intermediate layers 207 between the EL layers.

The following shows behaviors of electrons and holes in the intermediate layer 207 between the EL layer 203($m$) and the EL layer 203($m$+1). When a voltage higher than the threshold voltage of the light-emitting element is applied between the first electrode 201 and the second electrode 205, holes and electrons are generated in the intermediate layer 207, and the holes move into the EL layer 203($m$+1) provided on the second electrode 205 side and the electrons move into the EL layer 203($m$) provided on the first electrode 201 side. The holes injected into the EL layer 203($m$+1) recombine with the electrons injected from the second electrode 205 side, so that a light-emitting substance contained in the EL layer 203($m$+1) emits light. Further, the electrons injected into the EL layer 203($m$) recombine with the holes injected from the first electrode 201 side, so that a light-emitting substance contained in the EL layer 203($m$) emits light. Thus, the holes and electrons generated in the intermediate layer 207 cause light emission in the respective EL layers.

Note that the EL layers can be provided in contact with each other with no intermediate layer provided therebetween when these EL layers allow the same structure as the intermediate layer to be formed therebetween. For example, when the charge-generation region is formed over one surface of an EL layer, another EL layer can be provided in contact with the surface.

Further, when emission colors of EL layers are made different, light emission of a desired color can be provided from the light-emitting element as a whole. For example, in a light-emitting element having two EL layers, when the emission colors of first and second EL layers are complementary, the light-emitting element can emit white light as a whole. This can be applied to a light-emitting element having three or more EL layers.

⟨⟨Materials of Light-Emitting Element⟩⟩

Examples of materials which can be used for the layers are described below. Note that each layer is not limited to a single layer, and may be a stack including two or more layers.

⟨Anode⟩

The electrode serving as the anode (the first electrode 201) can be formed using one or more kinds of conductive metals, alloys, conductive compounds, and the like. In particular, it is preferable to use a material with a high work function (4.0 eV or more). Examples include indium tin oxide (ITO), indium tin oxide containing silicon or silicon oxide, indium zinc oxide, indium oxide containing tungsten oxide and zinc oxide, graphene, gold, platinum, nickel, tungsten, chromium, molybdenum, iron, cobalt, copper, palladium, and a nitride of a metal material (e.g., titanium nitride).

When the anode is in contact with the charge-generation region, any of a variety of conductive materials can be used regardless of their work functions; for example, aluminum, silver, an alloy containing aluminum, or the like can be used.

⟨Cathode⟩

The electrode serving as the cathode (the second electrode 205) can be formed using one or more kinds of conductive metals, alloys, conductive compounds, and the like. In particular, it is preferable to use a material with a low work function (3.8 eV or less). Examples include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, and an alloy containing any of these rare earth metals.

Note that when the cathode is in contact with the charge-generation region, a variety of conductive materials can be used regardless of its work function. For example, ITO, indium tin oxide containing silicon or silicon oxide, or the like can be used.

The electrodes may be formed separately by a vacuum evaporation method or a sputtering method. Alternatively, when a silver paste or the like is used, a coating method or an inkjet method may be used.

⟨Hole-Injection Layer 301⟩

The hole-injection layer 301 contains a substance with a high hole-injection property.

Examples of the substance with a high hole-injection property include metal oxides such as molybdenum oxide, vanadium oxide, ruthenium oxide, tungsten oxide, and manganese oxide; and phthalocyanine-based compounds such as phthalocyanine (abbreviation: $H_2Pc$) and copper(II) phthalocyanine (abbreviation: CuPc).

Other examples of the substance with a high hole-injection property include high molecular compounds such as poly(N-vinylcarbazole) (abbreviation: PVK), poly(4-vinyltriphenylamine) (abbreviation: PVTPA); and high molecular compounds to which acid such as poly(3,4-ethylenedioxythiophene)/poly(styrenesulfonic acid) (PEDOT/PSS) is added.

The hole-injection layer 301 may serve as the charge-generation region. When the hole-injection layer 301 in contact with the anode serves as the charge-generation region, any of a variety of conductive materials can be used for the anode regardless of their work functions. Materials contained in the charge-generation region will be described later.

⟨Hole-Transport Layer 302⟩

The hole-transport layer 302 contains a substance with a high hole-transport property.

The substance with a high hole-transport property is a substance with a property of transporting more holes than electrons, and is especially preferably a substance with a hole mobility of $10^{-6}$ cm$^2$/Vs or more. A variety of compounds can be used. For example, an aromatic amine compound such as 4,4'-bis[N-(1-naphthyl)-N-phenylamino]biphenyl (abbreviation: NPB or α-NPD) or 4-phenyl-4'-(9-phenylfluoren-9-yl)triphenylamine (abbreviation: BPAFLP); a carbazole derivative such as 4,4'-di(N-carbazolyl)biphenyl (abbreviation: CBP), 9-[4-(10-phenyl-9-anthracenyl)phenyl]-9H-carbazole (abbreviation: CzPA), or 9-phenyl-3-[4-(10-phenyl-9-anthryl)phenyl]-9H-carbazole (abbreviation: PCzPA); an aromatic hydrocarbon compound such as 2-tert-butyl-9,10-di(2-naphthyl)anthracene (abbreviation: t-BuDNA), 9,10-di(2-naphthyl)anthracene (abbreviation: DNA), or 9,10-diphenylanthracene (abbreviation: DPAnth); a high molecular compound such as PVK or PVTPA.

⟨Light-Emitting Layer 303⟩

For the light-emitting layer 303, a fluorescent compound which exhibits fluorescence or a phosphorescent compound which exhibits phosphorescence can be used.

Examples of the fluorescent compound that can be used for the light-emitting layer 303 include N,N'-bis[4-(9H-carbazol-9-yl)phenyl]-N,N'-diphenylstilbene-4,4'-diamine (abbreviation: YGA2S), N-(9,10-diphenyl-2-anthryl)-N,9-diphenyl-9H-carbazol-3-amine (abbreviation: 2PCAPA), and rubrene.

Examples of the phosphorescent compound that can be used for the light-emitting layer 303 include organometallic complexes such as bis[2-(4',6'-difluorophenyl)pyridinato-N,$C^{2'}$]iridium(I) picolinate (abbreviation: FIrpic), tris(2-phenylpyridinato-N,$C^{2'}$)iridium(III) (abbreviation: Ir(ppy)$_3$), and (acetylacetonato)bis(3,5-dimethyl-2-phenylpyrazinato)iridium(III) (abbreviation: Ir(mppr-Me)$_2$(acac)).

The light-emitting layer 303 may have a structure in which any of the above-described light-emitting organic compounds (a light-emitting substance or a guest material) is dispersed in another substance (a host material). As the host material, a variety of kinds of materials can be used, and it is preferable to use a substance which has a lowest unoccupied molecular orbital level (LUMO level) higher than that of the guest material and has a highest occupied molecular orbital level (HOMO level) lower than that of the guest material.

With the structure in which the guest material is dispersed in the host material, crystallization of the light-emitting layer 303 can be inhibited. Furthermore, concentration quenching due to high concentration of the guest material can be suppressed.

As the host material, the above-described substance with a high hole-transport property (e.g., an aromatic amine compound or a carbazole derivative) or a later-described substance with a high electron-transport property (e.g., a metal complex having a quinoline skeleton or a benzoquinoline skeleton or a metal complex having an oxazole-based or thiazole-based ligand) can be used. As the host material, specifically, a metal complex such as tris(8-quinolinolato)aluminum(III) (abbreviation: Alq) or bis(2-methyl-8-quinolinolato)(4-phenylphenolato)aluminum(III) (abbreviation: BAlq); a heterocyclic compound such as 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP); a condensed aromatic compound such as CzPA, DNA, t-BuDNA, or DPAnth; or an aromatic amine compound such as NPB can be used.

Alternatively, as the host material, a plurality of kinds of materials can be used. For example, in order to suppress crystallization, a substance such as rubrene that suppresses crystallization may be further added. In addition, NPB, Alq, or the like may be further added in order to transfer energy to the guest material more efficiently.

Further, when a plurality of light-emitting layers are provided and emission colors of the light-emitting layers are made different, light emission of a desired color can be provided from the light-emitting element as a whole. For example, in a light-emitting element having two light-emitting layers, the emission colors of first and second light-emitting layers are complementary, so that the light-emitting element can emit white light as a whole. Further, the same applies to a light-emitting element having three or more light-emitting layers.

⟨Electron-Transport Layer 304⟩

The electron-transport layer 304 contains a substance with a high electron-transport property.

The substance with a high electron-transport property is an organic compound having a property of transporting more electrons than holes, and is especially preferably a substance with an electron mobility of $10^{-6}$ cm$^2$/Vs or more.

As the substance with a high electron-transport property, for example, a metal complex having a quinoline skeleton or a benzoquinoline skeleton, such as Alq or BAlq, can be used. Alternatively, a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) or the like can be used. Alternatively, TAZ, BPhen, BCP, or the like can be used.

⟨Electron-Injection Layer 305⟩

The electron-injection layer 305 contains a substance with a high electron-injection property.

Examples of the substance with a high electron-injection property include alkali metals, alkaline earth metals, and compounds thereof, such as lithium, cesium, calcium, lithium fluoride, cesium fluoride, calcium fluoride, and lithium oxide. In addition, a rare earth metal compound such as erbium fluoride can also be used. Furthermore, the substance for the electron-transport layer 304 described above can also be used.

⟨Charge-Generation Region⟩

The charge-generation region may have either a structure in which an electron acceptor (acceptor) is added to an organic compound with a high hole-transport property or a structure in which an electron donor (donor) is added to an organic compound with a high electron-transport property. Alternatively, these structures may be stacked.

As examples of an organic compound with a high hole-transport property, the above materials which can be used for the hole-transport layer can be given, and as examples of an organic compound with a high electron-transport property, the above materials which can be used for the electron-transport layer can be given.

Further, as examples of the electron acceptor, 7,7,8,8-tetracyano-2,3,5,6-tetrafluoroquinodimethane (abbreviation: F$_4$-TCNQ), chloranil, and the like can be given. In addition, transition metal oxides can be given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable because it is stable in the air, has a low hygroscopic property, and is easily handled.

Further, as the electron donor, it is possible to use an alkali metal, an alkaline earth metal, a rare earth metal, a metal belonging to Group 13 of the periodic table, or an oxide or a carbonate thereof. Specifically, lithium, cesium, magnesium, calcium, ytterbium, indium, lithium oxide, cesium carbonate, or the like is preferably used. Alternatively, an organic compound such as tetrathianaphthacene may be used as the electron donor.

The above-described layers included in the EL layer 203 and the intermediate layer 207 can be formed by any of the following methods: an evaporation method (including a vacuum evaporation method), a transfer method, a printing method, an inkjet method, a coating method, and the like.

This embodiment can be combined with any of the other embodiments in this specification as appropriate.

Embodiment 4

In this embodiment, electronic devices which include the light-emitting device of one embodiment of the present invention will be described with reference to FIGS. 6A to 6C.

The light-emitting device of one embodiment of the present invention can be used for a flash of a camera such as a digital still camera, a flash of a camera incorporated in a cellular phone (also called a cell phone or cellular phone device) or a portable information terminal having a photography function, or the like. Alternatively, the light-emitting device of one embodiment of the present invention can be used for a warning light, a beacon, illuminations for decorative purposes, or the like.

Figure 6A:
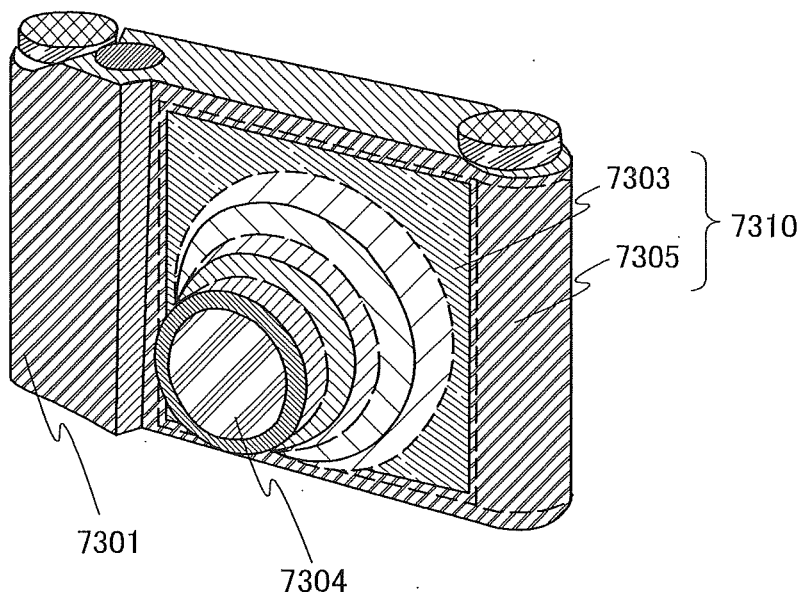
FIGS. 6A to 6C each illustrate an electronic device of one embodiment.

FIG. 6A illustrates an example of a digital still camera. A digital still camera 7300 includes a housing 7301, a lens 7304, a light-emitting device 7310, and the like. The light-emitting device of one embodiment of the present invention is applied to the light-emitting device 7310. A light-emitting portion 7303 of the light-emitting device 7310 is located so as to surround the lens 7304. The light-emitting device of one embodiment of the present invention is flexible and can thus be curved. In the digital still camera 7300, a non-light-emitting portion 7305 of the light-emitting device 7310 is bent to fit the shape of the housing 7301, which enables the light-emitting portion 7303 to be located over a large area around the lens 7304. This can make a shadow of a nose less likely to be cast on a cheek when a photograph of a human face is taken in a dark place using a flash, for example. Note that a light-emitting element may be formed in the non-light-emitting portion 7305 through the same process and may be used as an indicator of operating conditions.

Figure 6B:
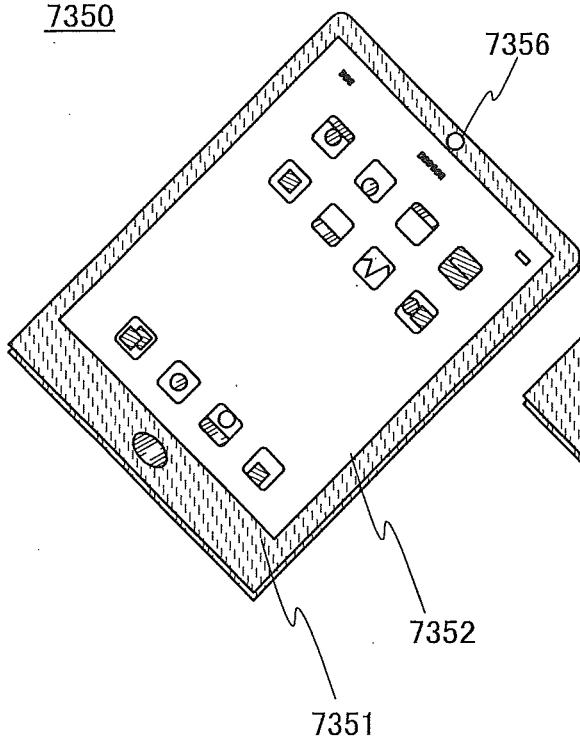
Figure 6C:
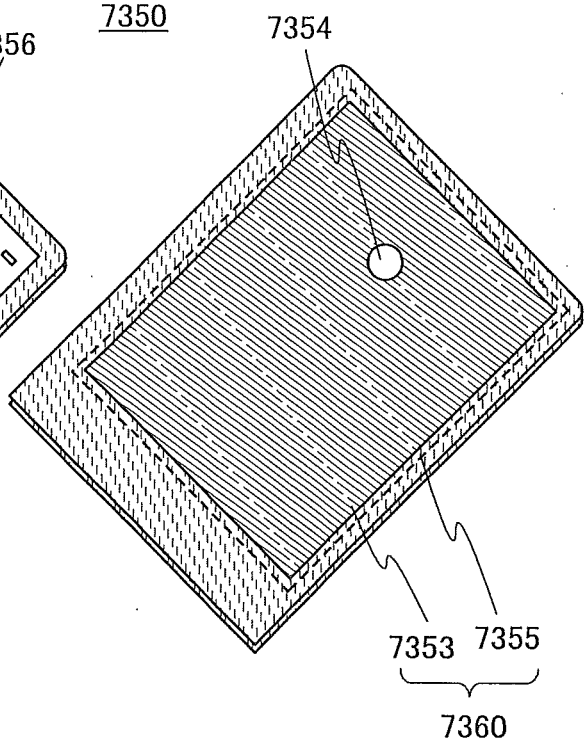

FIGS. 6B and 6C illustrate an example of a cellular phone. One side (also referred to as a front side) of a cellular phone 7350 is illustrated in FIG. 6B, and a side opposite the one side (also referred to as a back side) is illustrated in FIG. 6C.

The cellular phone 7350 includes a housing 7351, a display portion 7352, a lens 7354, a lens 7356, a light-emitting device 7360, and the like. The light-emitting device of one embodiment of the present invention is applied to the light-emitting device 7360. The light-emitting device 7360 includes a light-emitting portion 7353 and a non-light-emitting portion 7355, and the light-emitting portion 7353 is located so as to surround the lens 7354. The light-emitting portion 7353 may be used as a mirror when not emitting light.

Note that in the case where a photographic subject is located on the display portion 7352 side, an image of the subject can be taken using the lens 7356 and the display portion 7352 which partially or entirely functions as a light-emitting portion like the light-emitting portion 7353. In that case, the display portion 7352 can be changed into a light-emitting portion shortly before an image is taken. For example, the display portion 7352 may be partially or entirely used as a display portion for displaying a photographic subject, and the display portion may be changed into a light-emitting portion shortly before an image is taken. In a similar manner, the light-emitting portion 7353 can be partially or entirely used as a display portion.

This embodiment can be combined with any of the other embodiments in this specification as appropriate.

Example 1

In this example, a light-emitting device of one embodiment of the present invention will be described.

A plan view of a light-emitting panel manufactured in this example is illustrated in FIG. 3, and a cross-sectional view taken along dashed-dotted line X-Y in FIG. 3 is illustrated in FIG. 4B. Note that some components of the light-emitting panel are not illustrated in FIG. 3.

In the light-emitting panel of this example, as illustrated in FIG. 4B, the light-emitting element 1250 is provided over the support substrate 1229 having a light extraction structure, with the insulating film 1224 provided therebetween. The auxiliary wiring 1206 is provided over the insulating film 1224 and is electrically connected to the first electrode 1201. An end portion of the first electrode 1201 and an end portion of the terminal 1210 are covered with the partition wall 1205. Further, the partition wall 1205 is provided to cover the auxiliary wiring 1206 with the first electrode 1201 provided therebetween. The light-emitting element 1250 is sealed with the support substrate 1229, the sealing substrate 1228, and the sealing material 1227.

In the light-emitting panel of this example, a diffusion film of a polyester-based resin was used as the support substrate 1229, and a substrate including a thin glass layer and a polyethylene terephthalate (PET) layer was used as the sealing substrate 1228. These substrates are flexible, and the light-emitting panel of this example is a flexible light-emitting panel. The area of a light-emitting region of the light-emitting panel of this example is 56 mm×42 mm.

The light-emitting element 1250 is an organic EL element having a bottom-emission structure; specifically, the first electrode 1201 which transmits visible light is provided over the support substrate 1229, the EL layer 1202 is provided over the first electrode 1201, and the second electrode 1203 which reflects visible light is provided over the EL layer 1202.

A method for manufacturing the light-emitting panel of this example will be described.

First, a base film, a separation layer (a tungsten film), and a layer to be separated were formed in this order over a glass substrate that was a formation substrate. In this example, the layer to be separated includes the insulating film 1224, the auxiliary wiring 1206, the first electrode 1201, and the partition wall 1205.

A total of seven auxiliary wirings 1206 were formed over the insulating film 1224. At this time, the auxiliary wirings 1206 with a width L2 of 322 μm were formed at a pitch of 5.3 mm. As the first electrode 1201, a film of indium tin oxide containing silicon oxide (ITSO) was formed. A total of seven partition walls 1205 covering the auxiliary wirings 1206 were formed to have a width L1 of 330 μm.

Then, a temporary support substrate and the first electrode 1201 were attached using a separation adhesive. Then, the layer to be separated was separated from the formation substrate along the separation layer. Thus, the layer separated is provided on the temporary support substrate side.

Next, the layer which was separated from the formation substrate and where the insulating film 1224 was exposed was attached to the support substrate 1229 using a UV curable adhesive. As the support substrate 1229, a diffusion film of a polyester-based resin was used as described above. Then, the temporary support substrate was separated, whereby the first electrode 1201 was exposed over the support substrate 1229.

Next, the EL layer 1202 and the second electrode 1203 were formed over the first electrode 1201. As the EL layer 1202, a first EL layer including a light-emitting layer containing a fluorescent compound emitting blue light, an intermediate layer, and a second EL layer including a light-emitting layer containing a phosphorescent compound emitting green light and a light-emitting layer containing a phosphorescent compound emitting red light were stacked in this order from the first electrode 1201 side. Silver was used for the second electrode 1203.

Then, a photo-curable resin containing zeolite which serves as the sealing material 1227 was applied and cured by UV light irradiation. Next, the support substrate 1229 and the substrate including the thin glass layer and the polyethylene terephthalate (PET) layer which was the sealing substrate 1228 were attached to each other using a UV curable adhesive.

Figure 7:
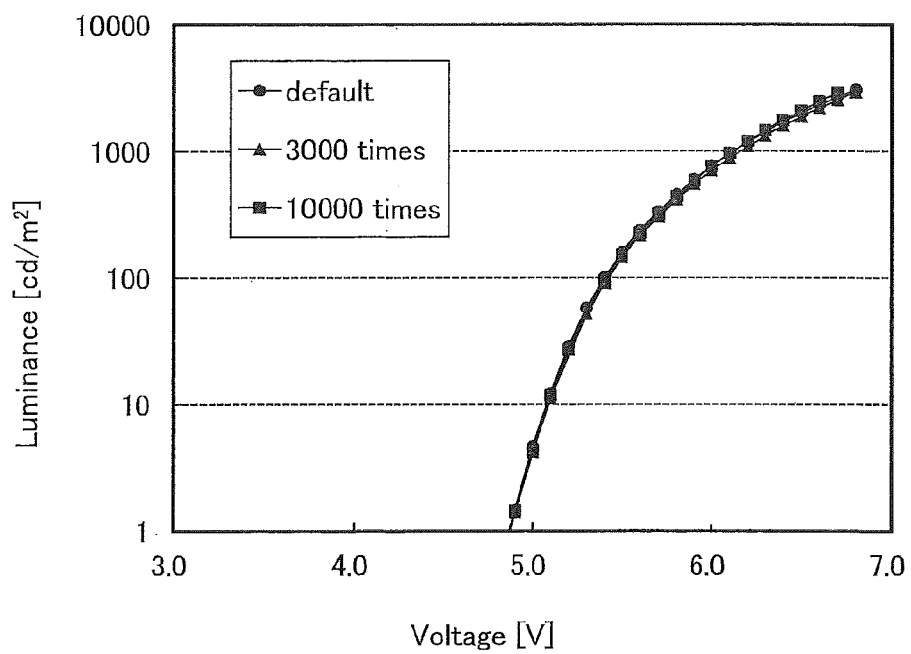
FIG. 7 shows voltage-luminance characteristics of a light-emitting panel of one example.
Figure 8:
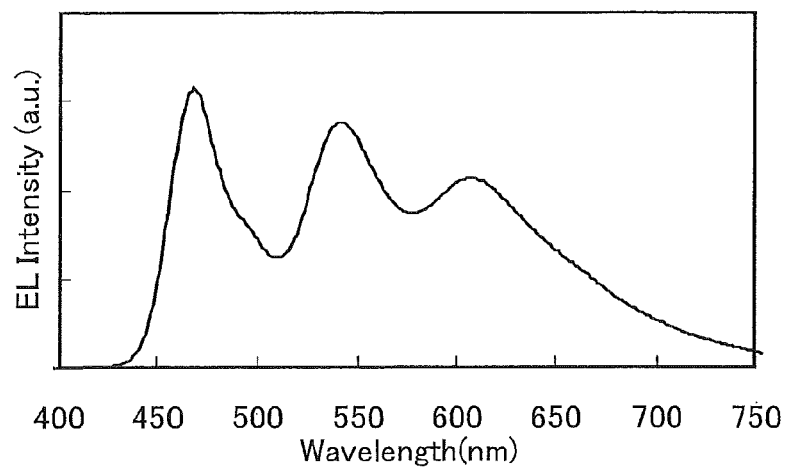
FIG. 8 shows an emission spectrum of a light-emitting panel of one example.

Operation characteristics of the light-emitting panel obtained in the above manner were measured. Voltage-luminance characteristics of the light-emitting panel are shown in FIG. 7 as indicated by "initial" in a legend. An emission spectrum of the light-emitting panel is shown in FIG. 8. As shown in FIG. 8, it is found that the light-emitting panel of this example shows an emission spectrum including light originating from the fluorescent compound emitting blue light, light originating from the phosphorescent compound emitting green light, and light originating from the phosphorescent compound emitting red light.

After that, a light-emitting device including the light-emitting panel was subjected to a reliability test. In the reliability test, the light-emitting panel was made to emit light 3000 times or 10000 times with intervals. For each time of light emission, a current of 2 A flowed in the light-emitting panel for 50 milliseconds (ms). The interval between light emissions (non-light-emitting period) was 10 seconds.

FIG. 7 shows voltage-luminance characteristics of the light-emitting panel after 3000 times of light emission and those after 10000 times of light emission.

It can be seen from FIG. 7 that the voltage-luminance characteristics of the light-emitting panel even after 10000 times of light emission does not significantly differ from those before the reliability test and that the light-emitting panel does not deteriorate. This supports that the light-emitting device of one embodiment of the present invention has high reliability.

EXPLANATION OF REFERENCE

100A: light-emitting device, 100B: light-emitting device, 110: switching circuit, 120: light-emitting panel, 130: driver circuit, 132: start switch, 140A: constant current DC power source, 140B: constant current DC power source, 150: counter circuit, 201: first electrode, 203: EL layer, 203a: EL layer, 203b: EL layer, 205: second electrode, 207: intermediate layer, 301: hole-injection layer, 302: hole-transport layer, 303: light-emitting layer, 304: electron-transport layer, 305: electron-injection layer, 401: support substrate, 403: light-emitting element, 405: sealing substrate, 407: sealing material, 409a: terminal, 409b: terminal, 411a: light extraction structure, 411b: light extraction structure, 413: planarization layer, 415: space, 417: auxiliary wiring, 419: insulating layer, 421: first electrode, 423: EL layer, 425: second electrode, 1201: first electrode, 1202: EL layer, 1203: second electrode, 1205: partition wall, 1206: auxiliary wiring, 1209: light extraction structure, 1210: terminal, 1220: support substrate, 1224: insulating film, 1227: sealing material, 1228: sealing substrate, 1229: support substrate, 1250: light-emitting element, 7300: digital still camera, 7301: housing, 7303: light-emitting portion, 7304: lens, 7305: non-light-emitting portion, 7310: light-emitting device, 7350: cellular phone, 7351: housing, 7352: display portion,

7353: light-emitting portion, 7354: lens, 7355: non-light-emitting portion, and 7360: light-emitting device.

This application is based on Japanese Patent Application serial no. 2013-107153 filed with Japan Patent Office on May 21, 2013, the entire contents of which are hereby incorporated by reference.

The invention claimed is:

1. A semiconductor device comprising:
   a light-emitting panel; and
   a camera comprising a lens,
   wherein the light-emitting panel and the lens are over the same side of a substrate,
   wherein the light-emitting panel is configured to be used for a display,
   wherein the light-emitting panel is configured to be used for a flash of the camera,
   wherein the light-emitting panel includes a touch panel,
   wherein the flash is surface emitting, and
   wherein an area of the surface emitting is more than or equal to 5 cm$^2$ and less than or equal to 200 cm$^2$.

2. The semiconductor device according to claim 1,
   wherein the light-emitting panel comprises a support substrate and a light-emitting element extending in a planar manner over the support substrate, and
   wherein the light-emitting element comprises a first electrode on a support substrate side, a second electrode overlapping with the first electrode, and an EL layer between the first electrode and the second electrode.

3. The semiconductor device according to claim 1,
   wherein the light-emitting panel comprises a curved surface, a support substrate having flexibility, and a light-emitting element extending in a planar manner over the support substrate, and
   wherein the light-emitting element comprises a first electrode on a support substrate side, a second electrode overlapping with the first electrode, and an EL layer between the first electrode and the second electrode.

4. A cellular phone or a digital still camera comprising the semiconductor device according to claim 1.

5. A semiconductor device comprising:
   a light-emitting panel; and
   a camera comprising a lens,
   wherein the lens is surrounded by the light-emitting panel,
   wherein the light-emitting panel and the lens are over the same side of a substrate,
   wherein the light-emitting panel is configured to be used for a display,
   wherein the light-emitting panel is configured to be used for a flash of the camera,
   wherein the light-emitting panel includes a touch panel,
   wherein the flash is surface emitting, and
   wherein an area of the surface emitting is more than or equal to 5 cm$^2$ and less than or equal to 200 cm$^2$.

6. The semiconductor device according to claim 5,
   wherein the light-emitting panel comprises a support substrate and a light-emitting element extending in a planar manner over the support substrate, and
   wherein the light-emitting element comprises a first electrode on a support substrate side, a second electrode overlapping with the first electrode, and an EL layer between the first electrode and the second electrode.

7. The semiconductor device according to claim 5,
   wherein the light-emitting panel comprises a curved surface, a support substrate having flexibility, and a light-emitting element extending in a planar manner over the support substrate, and
   wherein the light-emitting element comprises a first electrode on a support substrate side, a second electrode overlapping with the first electrode, and an EL layer between the first electrode and the second electrode.

8. A cellular phone or a digital still camera comprising the semiconductor device according to claim 5.

* * * * *